United States Patent [19]

Abe et al.

[11] Patent Number: 4,974,577
[45] Date of Patent: Dec. 4, 1990

[54] APPARATUS FOR COLLECTING WAFERS

[75] Inventors: Seiichi Abe, Sodegaura; Yoshitaka Shiratori, Tokyo; Tomoyoshi Sakamoto, Abiko, all of Japan

[73] Assignee: Mitsubishi Kinzoku Kabushiki Kaisha, Japan

[21] Appl. No.: 460,403

[22] Filed: Jan. 3, 1990

Related U.S. Application Data

[62] Division of Ser. No. 223,512, Jul. 22, 1988, Pat. No. 4,899,719.

[30] Foreign Application Priority Data

Jul. 31, 1987 [JP] Japan .................................. 62-192479
Jul. 31, 1987 [JP] Japan .................................. 62-192480

[51] Int. Cl.⁵ ............................................. B28D 1/04
[52] U.S. Cl. ................................. 125/13.01; 51/73 R
[58] Field of Search ................... 125/12, 13.01, 16.01;
   51/73 R, 215 CP, 215 VE, 215 R, 283 R, 217 R

[56] References Cited

U.S. PATENT DOCUMENTS

| 3,039,235 | 6/1962 | Heinrich | 125/13.01 |
| 4,002,246 | 1/1977 | Brandt et al. | 51/215 CP |
| 4,227,348 | 10/1980 | Demers | 125/13.01 |
| 4,420,909 | 12/1983 | Steere, Jr. | 51/73 R |
| 4,771,759 | 9/1988 | Zoebeli | 125/13.01 |

Primary Examiner—Robert A. Rose
Attorney, Agent, or Firm—Scully, Scott, Murphy & Presser

[57] ABSTRACT

An apparatus for collecting wafers sliced from a semiconductor crystal rod, and the apparatus includes a primary mobile member, a secondary mobile member and a wafer collecting assembly. The primary mobile member is movable toward and away the crystal rod, and the secondary mobile member is mounted on the primary mobile means and is movable relative to the primary mobile member in a direction toward and away from the semiconductor crystal rod. The wafer collecting assembly is mounted on the second mobile member for collecting the wafers sliced from the semiconductor crystal rod.

3 Claims, 7 Drawing Sheets

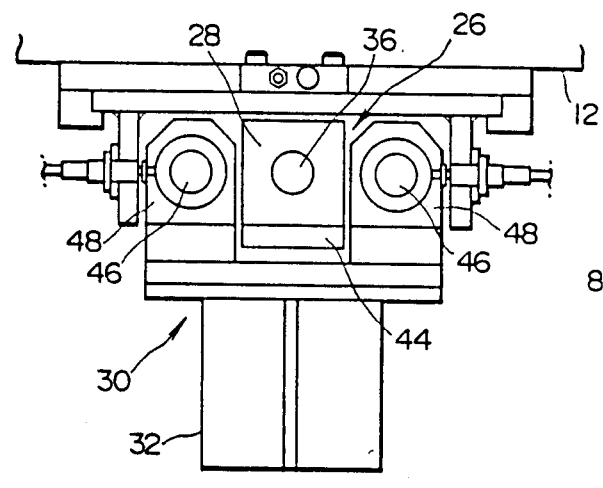
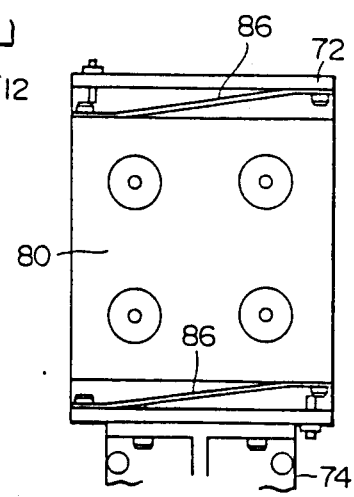
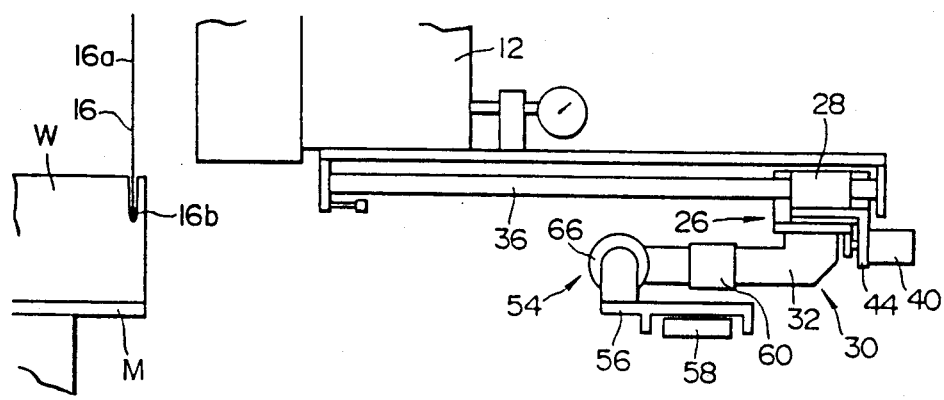
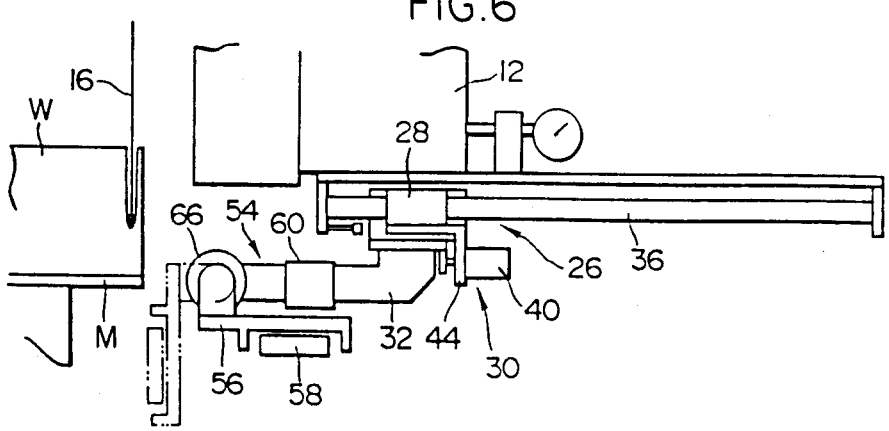

APPARATUS FOR COLLECTING WAFERS

This is a divisional of copending application Ser. No. 223,512, filed on July 22, 1988 now U.S. Pat. No. 4,899,719.

BACKGROUND OF THE INVENTION

1. Field of the Invention

The present invention relates to an apparatus for collecting wafers sliced from a semiconductor crystal rod.

2. Related Art

One related art wafer collecting apparatus of the aforedescribed type comprises a vacuum chuck of silicon rubber for chucking a wafer the moment it is cut off from a semiconductor single-crystal rod by an inside diameter blade. The related art apparatus has, however, been so simple in structure that it cannot be adapted to a slicing machine hitherto developed. Further, the related art apparatus has another drawback that since the wafer often adheres to the inside diameter blade due to the surface tension of coolant applied between the wafer and the blade, the vacuum chuck may fail to hold the wafer to drop it when chucking it.

SUMMARY OF THE INVENTION

It is therefore a primary object of the present invention to provide an apparatus for collecting wafers which can be successfully adapted to a slicing machine hitherto used.

Another object of the invention is to provide an improved wafer collecting apparatus which can smoothly collect the wafers without failure.

The above and other objects of the invention are accomplished by the apparatus of the herein invention which comprises primary drive means, secondary drive means and a wafer collecting assembly. The primary drive means includes a primary mobile member movable toward and away from an end face of the semiconductor crystal rod. The secondary drive means is mounted on the primary mobile member and has a secondary mobile member movable relative to the primary mobile member in a direction toward and away from the end face of the semiconductor crystal rod. The wafer collecting assembly is mounted on the secondary mobile member and is operable to collect the wafers sliced from the semiconductor rod.

BRIEF DESCRIPTION OF THE DRAWINGS

FIG. 3 is a view of the apparatus of FIG. 1 as seen in the direction indicated by the arrow III—III in FIG. 1;

FIG. 4 is a view as seen in the direction indicated by the arrow IV—IV in FIG. 1;

FIG. 5 is a schematic view of the apparatus of FIG. 1, but showing the apparatus in an initial operating condition;

FIG. 6 is a view similar to FIG. 5, but showing the apparatus in a condition wherein a primary mobile member is moved to its forward end position;

DESCRIPTION OF THE PREFERRED EMBODIMENTS OF THE INVENTION

Figure 1:
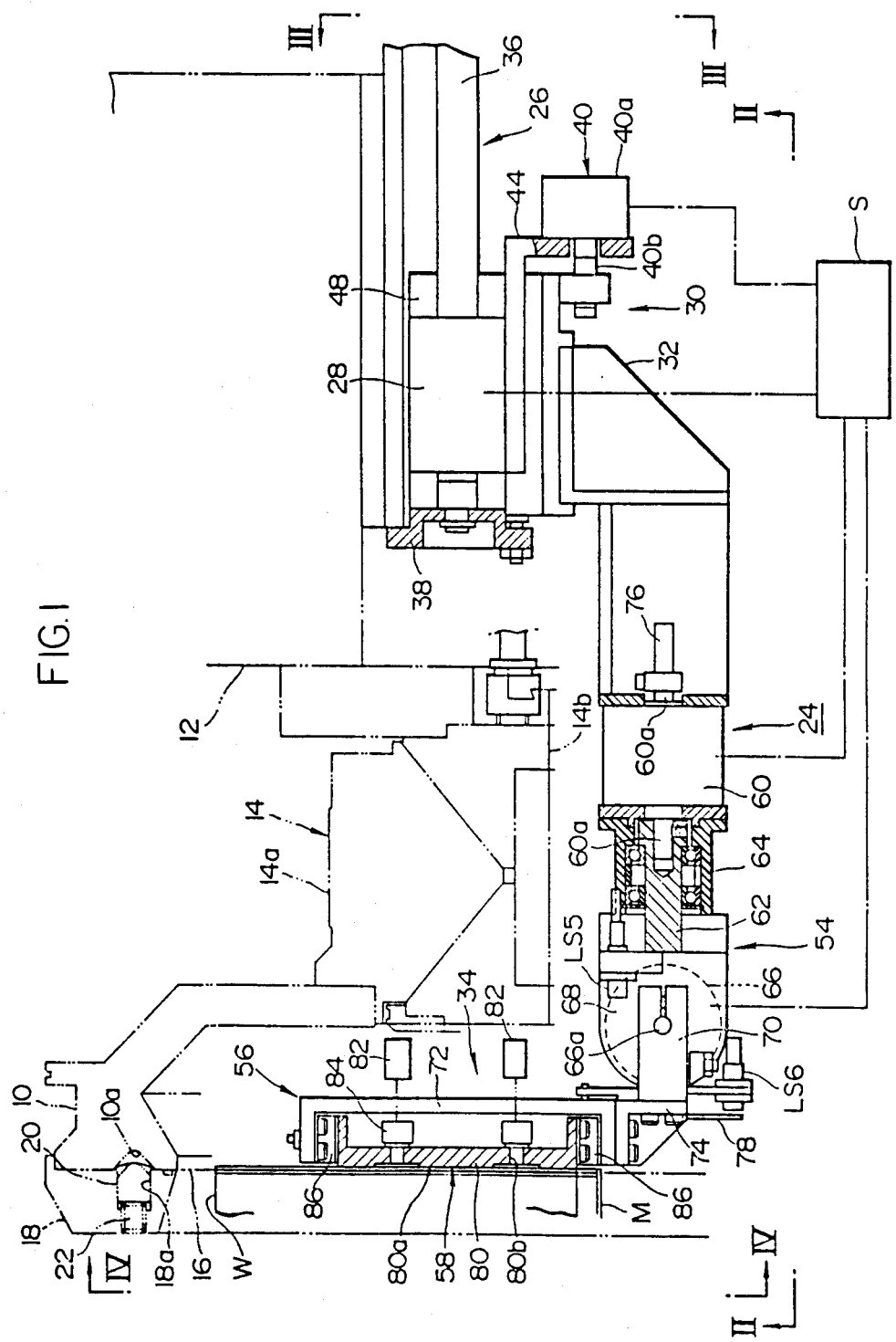
FIG. 1 is a side elevation of a wafer collecting apparatus in accordance with the present invention, the apparatus being shown partly in cross section.

There is shown in phantom in FIG. 1 a slicing machine for cutting a semiconductor single-crystal rod W into slices i.e. wafers. The slicing machine includes a chuck head 10 rotatably connected to a base frame 12 through a pneumatic bearing 14, and an inside diameter blade or saw 16 fixedly secured to the chuck head 10. The inside diameter blade 16 includes an annular thin body 16a having a central opening and abrasive grains deposited on an inner periphery of the body for serving as an inner peripheral cutting edge 16b. The chuck head 10 includes an annular groove 10a formed in its annular forward end face. An annular blade mounting ring 18, which is provided with an annular groove 18a formed in its rearward end face, is fitted on the forward end face of the chuck head 10 with the annular groove 18a opposed to the annular groove 10a of the chuck head 10. The inside diameter blade 16 is disposed between the chuck head 10 and the blade mounting ring 18 with its outer peripheral portion sandwiched between the annular forward end face of the chuck head 10 and the blade mounting ring 18. An annular retaining ring 20 is fitted in the groove 18a of the blade ring 18 and urged by suitable screws 22 toward the chuck head 10, to thereby press the outer peripheral portion of the blade 16 rearwardly to impart a prescribed tension to the blade 16. The pneumatic bearing 14 is comprised of an outer rotating member 14a fixedly secured to a rearward end face of the chuck head 10 and an inner fixed member 14b disposed within the rotating member 14a and fixedly secured to the base frame 12. The semiconductor single-crystal rod W is aherringly placed on a mounting plate M of carbon or the like, so that the wafers cut off from the semiconductor crystal rod W are prevented from falling off. The semiconductor crystal rod W is adapted to be introduced into the opening of the blade 16 in a direction perpendicular to the blade 16, and to be then moved transversely upwardly, so that the crystal ingot W can be brought into cutting engagement with the inner peripheral cutting edge 16b of the blade 16 and can be cut transversely into thin wafers.

As shown in FIGS. 1 to 4, an automatic wafer collecting apparatus 24 in accordance with a first embodiment of the present invention is mounted on the slicing machine thus constructed. The collecting apparatus 24 comprises a primary drive means or assembly 26 including a primary mobile member 28 movable toward and away from an end face of the semiconductor crystal rod W, a secondary drive means or assembly 30 mounted on the primary mobile member 28 and having a secondary mobile member 32 movable relative to the primary mobile member 28 in a direction toward and away from the end face of the semiconductor crystal rod W, and a wafer collecting assembly 34 mounted on the second mobile member 32 for collecting wafers sliced from the semiconductor rod W, one by one.

The primary drive assembly 26 includes an actuator in the form of a magnet type pneumatic rodless cylinder which is comprised of a cylinder body serving as the above-mentioned primary mobile member 28 and an elongated piston 36 fixedly mounted on the base frame 12 through suitable brackets 38. The secondary drive assembly 30 comprises a pneumatic cylinder 40 carrying the above-mentioned secondary mobile member 32 and a guide assembly 42 for permitting the smooth movement of the secondary mobile member 32. The cylinder 40 comprises a cylinder body 40a fixedly mounted on the primary mobile member 28 through a bracket 44 and a piston rod 40b disposed so as to extend parallel to the piston 36 of the primary drive assembly 26. The secondary mobile member 32 is fixedly mounted on the piston rod 40b of the cylinder 40. The guide assembly 42 includes a pair of guide rods 46 fixedly mounted on the base frame 12 through the suitable brackets 38 and extending parallel to the piston 36 of the primary drive assembly 26. The secondary mobile member 32 is slidably supported by the pair of guide rods 46 through linear bearings 48. With this construction, the secondary drive assembly 30, which includes the secondary mobile member 32, is adapted to move along the guide rods 46 together with the primary mobile member 28 as the primary mobile member 28 moves along the piston 36, and the secondary mobile member 32 is adapted to slide along the guide rods 46 relative to the primary mobile member 28 when the cylinder 40 is actuated. There are also provided first and second limit switches LS1 and LS2 which are mounted on suitable brackets on the base frame 12. The first limit switch LS1 is disposed adjacent to one of the linear bearings 48 and is operable to detect a first projection 50 attached to the one liner bearing 48 to produce a first command signal for rotating the wafer collecting assembly 34 180° the moment the primary mobile member 28 reaches a prescribed position. The second limit switch LS2 is disposed adjacent to the other linear bearing 48 and is operable to detect a second projection 52 attached to the other linear bearing 48 to produce a second command signal for further operating the collecting assembly 34 the moment the primary mobile member 28 reaches its forward end.

The wafer collecting assembly 34 comprises an attitude control mechanism 54 mounted on the secondary mobile member 32, a support assembly 56 mounted on the attitude control mechanism 54, and a vacuum chuck 58 disposed on the support assembly 56. The attitude control mechanism 54 comprises a first oscillating rotary actuator or motor 60 fixedly secured to a forward end of the secondary mobile member 32 and having an output shaft 60a extending forwardly and rearwardly so as to be generally parallel to the piston 36 of the primary drive assembly 26, a support member 62 fixedly secured at its rearward end to the forward portion of the output shaft 60a and rotatably supported by the actuator 60 through a bearing 64, and a second oscillating rotary actuator or motor 66 fixedly mounted on the support member 62 through a bracket 68. The bracket 68 is of a channel shape having a pair of opposed plate portions, and the second rotary actuator 66 is supported by the opposed plates with forward and rearward portions of an output shaft 66a extending therethrough. The first rotary actuator 60 is operable to rotate its output shaft 60a 180° while the second rotary actuator 66 is operable to rotate its output shaft 66a 90°.

The support assembly 56 comprises an opposed pair of support arms 70 fixedly secured to the forward and rearward portions of the shaft 66a of the second rotary actuator 66 and a channel shaped support body 72 fixedly secured to the support arms 70 through a bracket 74.

Figure 2:
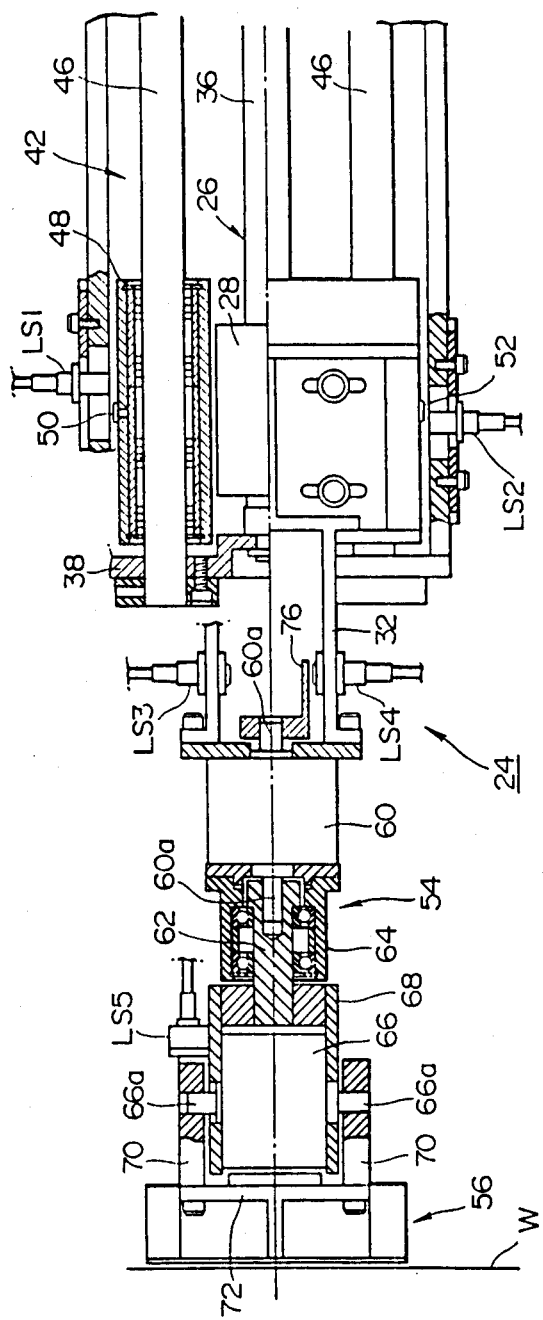
FIG. 2 is a partially cutaway bottom view of the apparatus of FIG. 1 as seen in the direction indicated by the arrow II—II in FIG. 1.

A generally L-shaped lever 76 is affixed to the rearward portion of the output shaft 60a of the first motor 60 which is extending toward the secondary mobile member 32. As best shown in FIG. 2, third and fourth limit switches LS3 and LS4 are attached to the secondary mobile member 32 so as to be opposed to the lever 70, and are operable to sense the angle of rotation of the output shaft 60a to produce output signals when the shaft 60a is rotated 180°. Further, there are also provided fifth and sixth limit switches LS5 and LS6 for sensing the 90° rotation of the output shaft 66a of the second rotary actuator 66. The fifth limit switch LS5 is affixed to an outer face of one of the opposite plate portions of the bracket 68, and is operable to sense one of the arms 70 when it reaches to a position adjacent to the switch, while the sixth limit switch LS6 is disposed so that it can sense a dog plate 78 affixed to the bracket 74.

The vacuum chuck 58 comprises a chuck body 80 formed of aluminum and a plurality of vacuum generating units 82. The chuck body 80 has a chucking face 80a to be brought into chucking engagement with the wafer and has a plurality of apertures 80b formed therethrough. Each vacuum generating unit 82, which is comprised of a known ejector type vacuum pump, is connected to a respective one of the apertures 80b through a fitting 84 and a suitable tube. The chuck body 80 is disposed within the channel shaped support body 72 in such a manner that the upper and lower ends are spaced from the opposed plates of the support body 72 so as to define spaces therebetween. A pair of leaf springs 86 are housed in the spaces, respectively, so that they can cooperate with each other to hold the chuck body 80 therebetween. With this construction, the chuck body 80 is adapted to be vertically movable, for example, by about 10 mm.

Further, the limit switches and actuators as described above are all connected to a sequence control unit S for effecting a sequence control of the wafer collecting operation.

The operation of the wafer collecting apparatus thus constructed will now be described mainly with reference to FIGS. 5 to 9. The wafer collecting apparatus is in advance located in a shunted position as shown in FIG. 5. More specifically, the primary mobile member 28 is situated on a rearward end of the piston 36 of the primary drive assembly 26, and the piston rod 40b of the cylinder 40 is in its retracted position. The vacuum chuck 58 is in such a position that the chucking face 80a of the chuck boy 80 is facing downwardly.

For commencing the collecting of the wafers sliced from the semiconductor crystal rod W, the rodless cylinder is first actuated to move the primary mobile member 28 along the piston 36 toward its forward end as shown in FIG. 6. As the primary mobile member 28 moves, the secondary mobile member 32 moves forwardly toward the end face of the semiconductor ingot W while being supported by the pair of guide rods 46.

Figure 7:
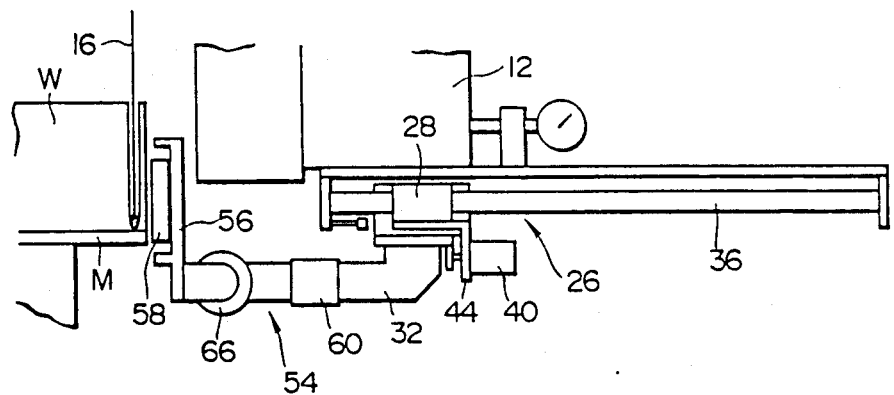
FIG. 7 is a view similar to FIG. 5, but showing the apparatus in a condition wherein the vacuum chuck is opposed to the end face of the semiconductor crystal ingot.
Figure 8:
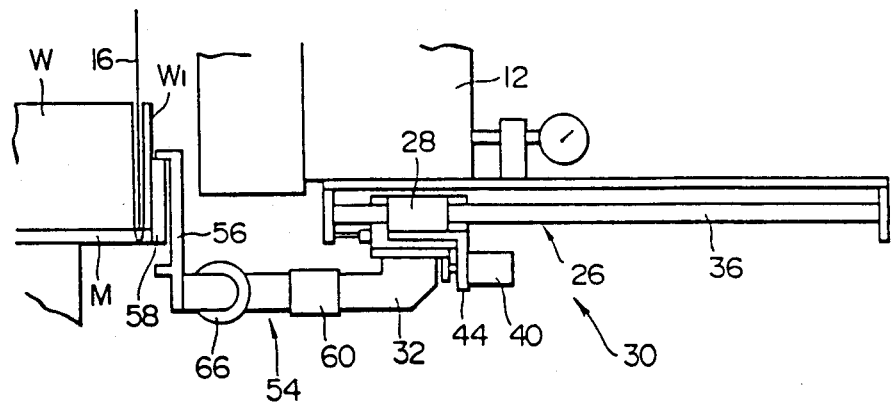
FIG. 8 is a view similar to FIG. 5, but showing the apparatus immediately before one wafer is cut off.

When the primary mobile member 28 as well as the secondary mobile member 32 has reached a prescribed position on the piston 36, the first limit switch LS1 detects the first projection 50 to produce command signals to activate the second rotary actuator 66 and to subsequently activate the first rotary actuator 60. Thus, the output shaft 66a of the second rotary actuator 66 is caused to rotate 90° as designated by two dot and dash line in FIG. 6, and the output shaft 60a of the first rotary actuator 60 is rotated 180° as shown in FIG. 7, so that the vacuum chuck 58 is indexed in such a position that the chucking face 80a faces to the end face of the semiconductor crystal ingot W which is being sliced by the blade 16.

Subsequently, the piston rod 40a of the pneumatic cylinder 40 is caused to extend at a low speed to thereby cause the secondary mobile member 32 to move forwardly at a low speed until the second limit switch LS2 senses the second projection 53, so that the vacuum chuck 58 is caused to move to a position adjacent to the end face of semiconductor crystal ingot W. Thereafter, the vacuum generating units 82 of the vacuum chuck 58 is actuated to generate vacuum suction in the chuck body 80, so that the wafer $W_1$, which is about to be cut off from the semiconductor crystal ingot W, adheres to the chucking face 80a of the chuck body 80. In this condition, the cutting of the wafer is continued by further moving the semiconductor crystal ingot W upwardly in FIG. 8. Then, as the semiconductor crystal ingot W moves upwardly, the vacuum chuck body 80 is also caused to move upwardly while chucking the wafer. Inasmuch as the vacuum chuck body 80 is supported by a pair of upper and lower leaf springs 86 so that it can be moved vertically, it is less susceptible to any undesirable twisting forces in a horizontal direction. Accordingly, the vacuum chuck body 80 can firmly hold the wafer sliced to prevent it from falling down.

Figure 9:
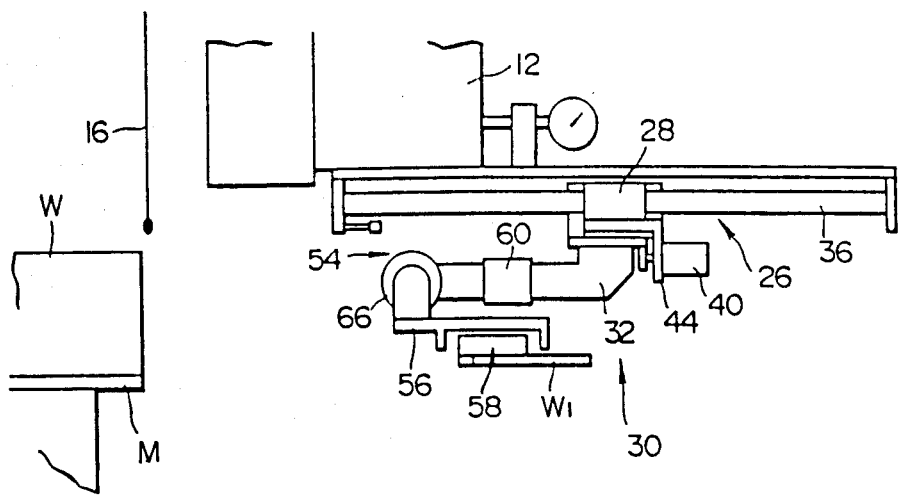
FIG. 9 is a view similar to FIG. 5, but showing the apparatus when the wafer is collected.

When the cutting of the semiconductor ingot W by the blade 16 is finished, the apparatus is operated in a reverse manner. Specifically, the pneumatic cylinder 40, the first rotary actuator 60, the second rotary actuator 66, and the primary drive assembly 26 are operated in succession, and thereby the sliced wafer $W_1$ is collected as shown in FIG. 9. Further, the semiconductor crystal rod W is moved downwardly to its original position, and is then moved toward the blade 16 by a prescribed amount, leading to the commencement of the next cycle of the slicing operation.

As described above, the wafers sliced from the semiconductor ingot can be collected by the above apparatus, one by one, and therefore the quality control of each wafer can be easily conducted. Since the apparatus is provided with the primary and secondary mobile members 28 and 32, the vacuum chuck body 80 can be moved to a position sufficiently near to the wafer which is being sliced. The wafers, therefore, can be chucked by the vacuum chuck 58 without failure, and can be collected efficiently and quickly. Further, the vacuum chuck body 80 has an increased rigidity since it is made of aluminum, and hence the wafer can be easily released from the blade 16 against the surface tension caused due to the coOlant applied between the blade 16 and the wafer. Moreover, in the above vacuum chuck 58, the vacuum generating pump 82 is attached to a respective one of the apertures 80b of the chuck body 80. Accordingly, the vacuum chuck 58 never fails to chuck the wafer even if some of the pumps 82 should be subjected to damage.

Figure 10:
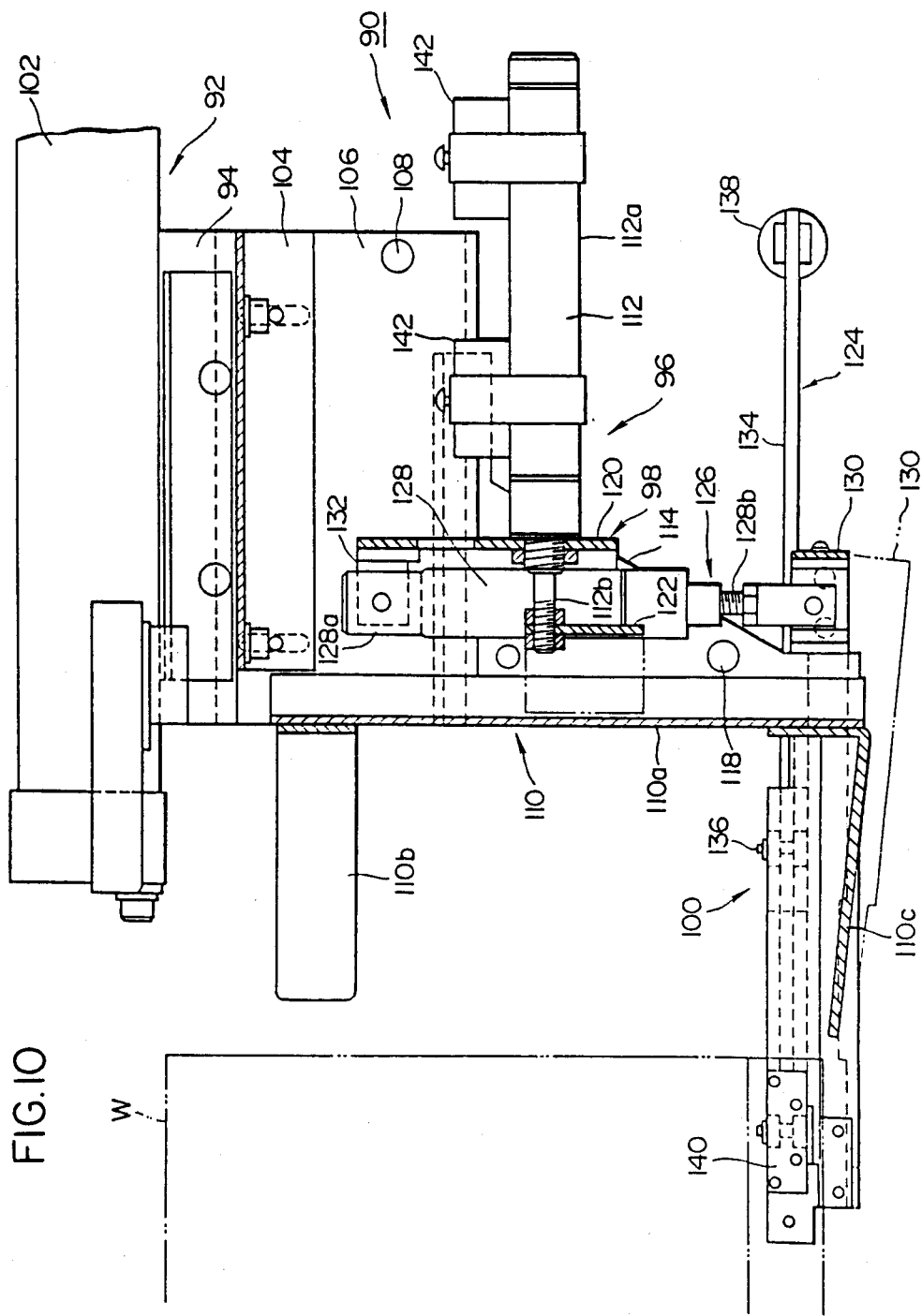
FIG. 10 is a side elevation of a modified collecting apparatus in accordance with the present invention.
Figure 11:
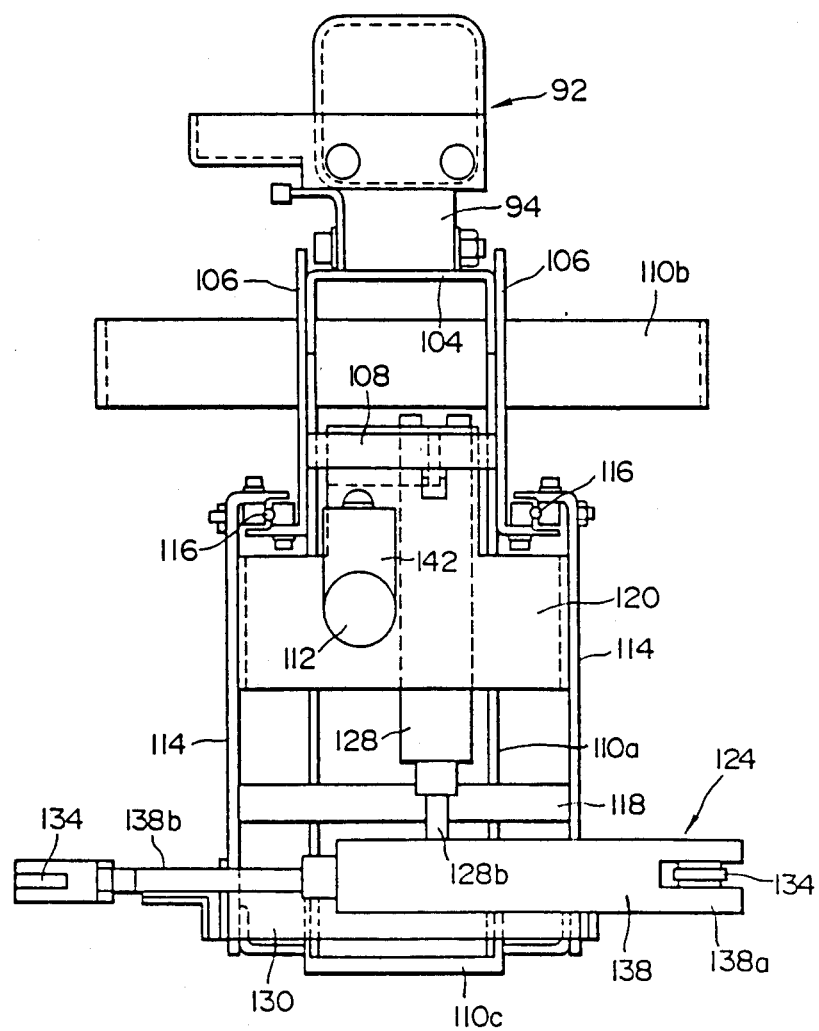
FIG. 11 is a rear view of the apparatus of FIG. 10.
Figure 12:
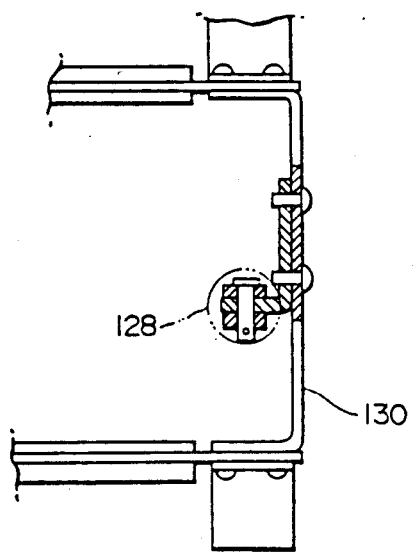
FIG. 12 is a bottom view of the apparatus of FIG. 10.

FIGS. 10 to 12 show a modified wafer collecting apparatus 90 in accordance with the present invention. As is the case with the apparatus of the first embodiment, the apparatus 90 comprises a primary drive assembly 92 provided with a primary mobile member 94 movable toward and away from the end face of the semiconductor crystal rod W, a secondary drive assembly 96 mounted on the primary mobile member 94 and having a secondary mobile member 98 movable relative to the primary mobile member 94 in a direction toward and away from the end face of the semiconductor crystal rod W, and a wafer collecting assembly 100 mounted on the secondary mobile member 98 for collecting wafers sliced from the semiconductor rod W.

The primary drive assembly 92 comprises a rodless cylinder having a cylinder body serving as the primary mobile member 94 and an elongated piston 102 fixedly mounted on a base frame. The rodless cylinder is disposed so that the piston 102 extends generally perpendicular to the end face of the semiconductor crystal ingot W. Fixedly mounted on a lower face of the primary mobile member 94 through a channel shaped bracket 104 are a pair of right and left plate members 106 of a generally L-shaped cross section which are disposed in opposed relation to each other and connected together by a connecting rod 108. A support 110, which comprises a main frame 110a, a channel-shaped support arm 110b fixedly secured to a front face of the main frame 110a at its upper end and a support plate 110c fixedly secured to the front face of the frame 110a at its lower end, is fixedly secured to the forward ends of the plate members 106. As best shown in FIG. 10, the support plate 110c is so formed that it is inclined upwardly toward the semiconductor crystal rod W.

The secondary drive assembly 96 includes a pneumatic cylinder 112 comprised of a cylinder body 112a and a piston rod 112b. A pair of right and left plate members 114 are slidably supported by the lower ends of the pair of L-shaped members 106 through suitable bearings 116, respectively, and connected together by a connecting rod 118 and a connecting plate 120. The plate members 114, the connecting rod 118 and the connecting plate 120 cooperate to serve as the secondary mobile member 98 which is so constructed that it can be moved toward and away from the end face of the semiconductor crystal ingot W. The above cylinder 112 is mounted on the connecting plate 120 with its cylinder body 112a fixedly secured thereto, and a forward end of the piston rod 112b is rigidly affixed to the main frame 110a of the support 110 through a bracket 122.

The wafer collecting assembly 100 comprises a clamp mechanism 124 mounted on the secondary mobile member 98 and a pivoting mechanism 126 interposed between the secondary mobile member 96 and the clamp mechanism 124. The pivoting mechanism 126 includes a pivoting cylinder 128 which has a cylinder body 128a and a piston rod 128b, and a pivoting frame 130 which has a pair of right and left side frame portions and a rear frame portion connecting the ends of the side frame portions together. The pivoting frame 130 is pivotally connected at its forward end to the plate members 114 of the secondary mobile member 98. The pivoting cylinder 128 is mounted on the upper end of the connecting plate 120 through a bracket 132 with its cylinder body 128a pivotally connected to the bracket 132 and with its piston rod 128b pivotally connected to the rear frame portion of the pivoting frame 130. The clamp mechanism 124 includes a pair of clamp arms 134 disposed along the right and left frame portions of the pivoting frame 130 and pivotally connected to the frame portions at their central portions through pins 136, respectively, in such a manner that each clamp arm can be pivoted horizontally about a respective pin 136. A clamp cylinder 138, which is comprised of a cylinder body 138a and a piston rod 138b, is connected between the rearward ends of the clamp arms 134 with its cylinder body 138a pivotally connected to the right clamp arm and with its piston rod 138b pivotally connected to the left clamp arm. Further, the clamp arms 134 are provided with clamps 140 at their forward ends, respectively. Thus, when the clamp cylinder 138 is acruated, the clamp arms 134 are caused to pivot about the pins 136 in a prescribed direction, so that the clamps 140 are moved toward or away from each other.

Further, the cylinder 112 of the secondary drive assembly 96 is provided with a pair of sensors 142 attached thereto for producing control signals to control the timing of the activation and stoppage of the clamp and pivoting cylinders. As is the case with the first embodiment, the sensors and all the cylinders are connected to a sequential control unit which sequentially controls the wafer collecting operation.

The wafer collecting apparatus as described above is operated for collecting a plurality of, say twenty to fifty, wafers once in a block form. The rodless cylinder 92 is first actuated to cause the primary mobile member 94 to move forwardly along the piston 102. When the primary mobile member 94 has reached its forward end position, the cylinder 112 is then activated and its piston rod 112b is retracted. Thus, the cylinder body 112a of the secondary cylinder 112 is caused to move still forwardly since the piston rod 112b is fixedly secured to the primary mobile member 94 through the support 110 and the like, and hence the secondary mobile member 98, the clamp mechanism 124 and the pivoting mechanism 126 are all caused to move forwardly, so that the right and left clamps 140 are brought into opposed relation to the opposite sides of the mounting plate M of carbon on which the semiconductor crystal rod W ia adheringly located.

Thereafter, the clamp cylinder 138 is activated to extend its piston rod 138b. With this operation, the clamp arms 134 are caused to pivot about the pins 136 in such a manner that the clamps 140 approach each other, so that the mounting plate M on which the semiconductor crystal rod W is adheringly placed is held by the clamps. Subsequently, the pivoting cylinder 128 is actuated to cause its piston rod 128b to extend downwardly, and hence the pivoting frame 132 pivotally connected thereto is caused to turn downwardly about the clamps 140. Thus, that portion of the mounting plate M seized by the clamps 140 is pressed downwardly while being clamped by the clamps firmly, and is cut off from the remaining portion, so that a wafer block consisting of a number of wafers is cut off from the semiconductor crystal ingot W while being firmly clamped by the clamps 140.

Subsequently, the cylinder 112 is actuated to extend its piston rod 112b, and hence the secondary mobile member 98 carrying the wafer collecting assembly 100 is caused to move rearwardly, so that the wafer block clamped by the clamp mechanism 124 is caused to move toward the support 110. Thereafter, the clamp cylinder 138 is actuated to move its piston rod to its retracted position, so that the wafer block which has been clamped by the clamps 140 is released therefrom, and seized by the support plate 110c of the support 110. In this condition, the rodless cylinder 92 is actuated to cause the primary mobile member 94 to move rearwardly, and therefore the wafer block held on the support 110 is smoothly collected.

As described above, by using the above wafer collecting apparatus, the wafer blocks can be collected very smoothly without failure. Such collecting operation can be conducted automatically without troubling the operator. Further, since the wafer collecting apparatus includes the primary and secondary drive assemblies, the apparatus can be successfully adapted to a slicing machine hitherto developed. In addition, since the wafer collecting assembly of the apparatus of the above embodiment is comprised of the clamp and pivoting mechanisms and does not include any vacuum chucks, the reliability of the collecting operation is further improved.

Obviously many modifications and variations of the present invention are possible in the light of the above teachings. It is therefore to be understood that within the scope of the appended claims, the invention may be practiced otherwise than as specifically described.

What is claimed is:

1. An automatic apparatus for collecting wafers sliced from a semiconductor crystal rod adheringly placed on a mounting plate, comprising:
   primary drive means including a primary mobile member movable toward and away from an end face of the semiconductor crystal rod;
   secondary drive means mounted on said primary mobile member and having a secondary mobile member movable relative to said primary mobile member in a direction toward and away from said end face of the semiconductor crystal rod; and
   a wafer collecting assembly mounted on said second mobile member for collecting said wafers sliced from the semiconductor crystal rod, and including
   (i) clamp means mounted on said secondary mobile member for clamping said mounting plate, and
   (ii) pivoting means for pivoting said clamp means to bend said mounting plate, whereby a block of the wafers sliced from the semiconductor crystal rod and adheringly placed on said mounting plate are cut from the semiconductor crystal rod.

2. A wafer collecting apparatus according to claim 1, in which said pivoting means includes a pivoting frame for carrying said clamp means and a pivoting actuator interposed between said secondary mobile member and said pivoting frame for pivoting said pivoting frame; said clamp means including a pair of clamp arms pivotally connected to said pivoting frame, a pair of clamps mounted on said clamp arms and a clamping actuator connected to said clamp arms for pivoting said clamp arms so that said clamps are moved toward and away from each other.

3. An automatic wafer collecting apparatus according to claim 2, further comprising a support fixedly mounted on said primary mobile member for receiving said wafers collected by said wafer collecting assembly.

* * * * *

UNITED STATES PATENT AND TRADEMARK OFFICE
CERTIFICATE OF CORRECTION

PATENT NO. : 4,974,577
DATED : December 4, 1990
INVENTOR(S) : Seiichi Abe, et al.

It is certified that error appears in the above-identified patent and that said Letters Patent is hereby corrected as shown below:

Column 2, line 30: delete space and add "being" between --18a-- and --opposed--

Column 5, line 62: "coOlant" should read as --coolant--

Column 7, line 13: "acruated," should read as --actuated,--

Signed and Sealed this

Fifth Day of May, 1992

*Attest:*

DOUGLAS B. COMER

*Attesting Officer*   *Acting Commissioner of Patents and Trademarks*